(12) United States Patent
Fox

(10) Patent No.: US 6,728,093 B2
(45) Date of Patent: Apr. 27, 2004

(54) METHOD FOR PRODUCING CRYSTALLOGRAPHICALLY TEXTURED ELECTRODES FOR TEXTURED PZT CAPACITORS

(75) Inventor: Glen Fox, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 118 days.

(21) Appl. No.: 10/190,351

(22) Filed: Jul. 3, 2002

(65) Prior Publication Data

US 2004/0004237 A1 Jan. 8, 2004

(51) Int. Cl.[7] ............................................. H01G 4/005
(52) U.S. Cl. ..................... 361/303; 361/311; 257/295
(58) Field of Search ............................... 361/303, 305, 361/311, 312, 313, 321.2; 257/295, 296, 753–754; 438/240, 244, 404, 479

(56) References Cited

U.S. PATENT DOCUMENTS

| | | |
|---|---|---|
| 5,142,437 A | 8/1992 | Kammerdiner et al. |
| 5,426,075 A | 6/1995 | Perion et al. |
| 5,519,566 A | 5/1996 | Perion et al. |
| 6,080,499 A | 6/2000 | Eastep |
| 6,090,443 A | 7/2000 | Eastep |
| 6,194,315 B1 * | 2/2001 | Hu et al. ................ 438/683 |
| 6,287,637 B1 | 9/2001 | Chu et al. |
| 6,396,094 B1 * | 5/2002 | Mirkarimi et al. .......... 257/295 |
| 6,420,784 B2 * | 7/2002 | Hu et al. ................ 257/754 |
| 6,528,387 B1 * | 3/2003 | Moriyasu et al. .......... 438/404 |

* cited by examiner

*Primary Examiner*—Anthony Dinkins
(74) *Attorney, Agent, or Firm*—Hogan & Hartson L.L.P.

(57) ABSTRACT

A bottom electrode structure and manufacturing method is described for producing crystallographically textured iridium electrodes for making textured PZT capacitors that enables enhanced ferroelectric memory performance. The use of seed layers originating from hexagonal crystal structures with {0001} texture provides a smooth surface for growth of {111} textured iridium, which exhibits the face-centered cubic ("FCC") structure. This seeding technique results in {111} textured iridium with a small surface roughness relative to the film thickness. The highly textured iridium supports {111} textured PZT dielectric layer growth. Textured PZT exhibits enhanced switched polarization, reduced operating voltage and also improves the reliability of PZT capacitors used in FRAM® memory and other microelectronic devices.

42 Claims, 8 Drawing Sheets

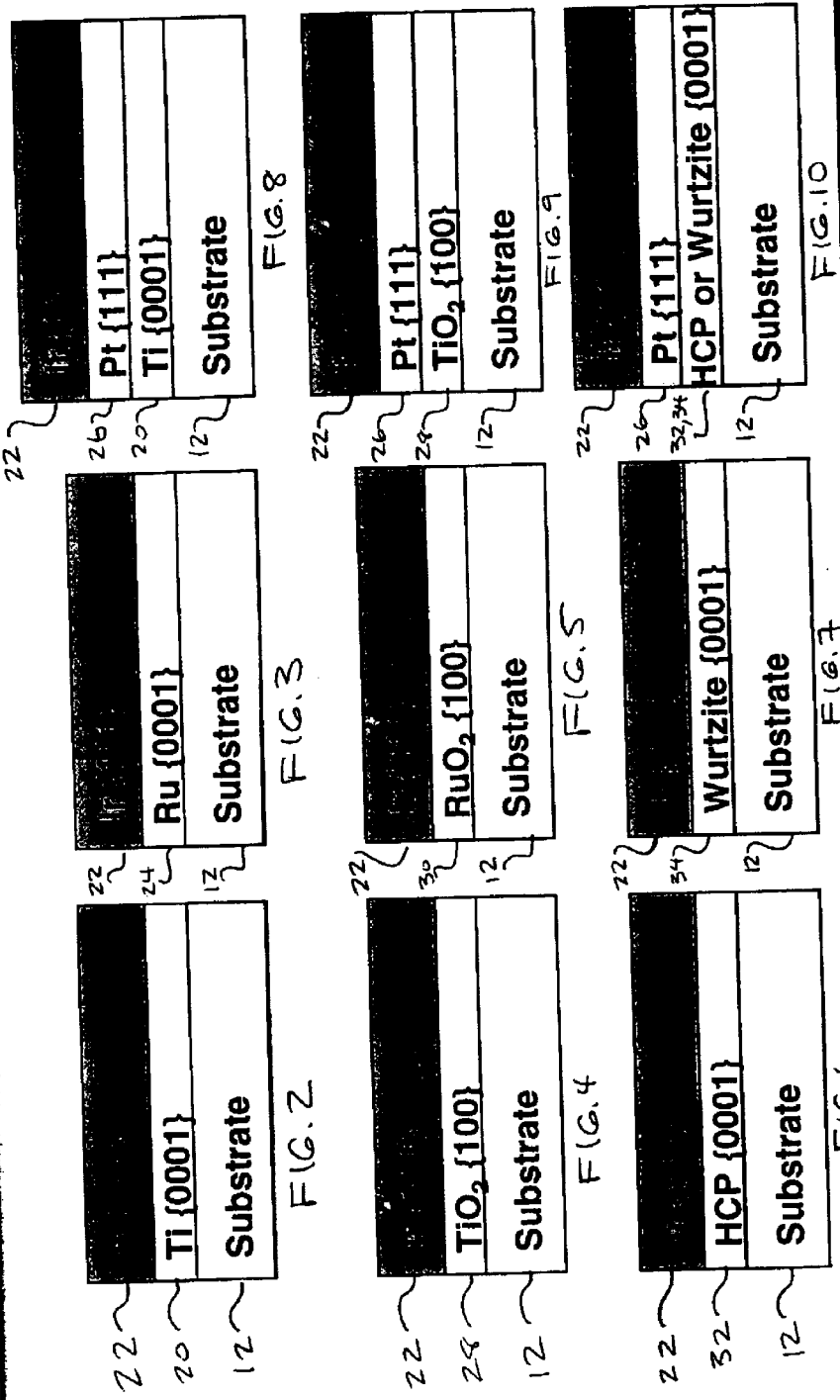

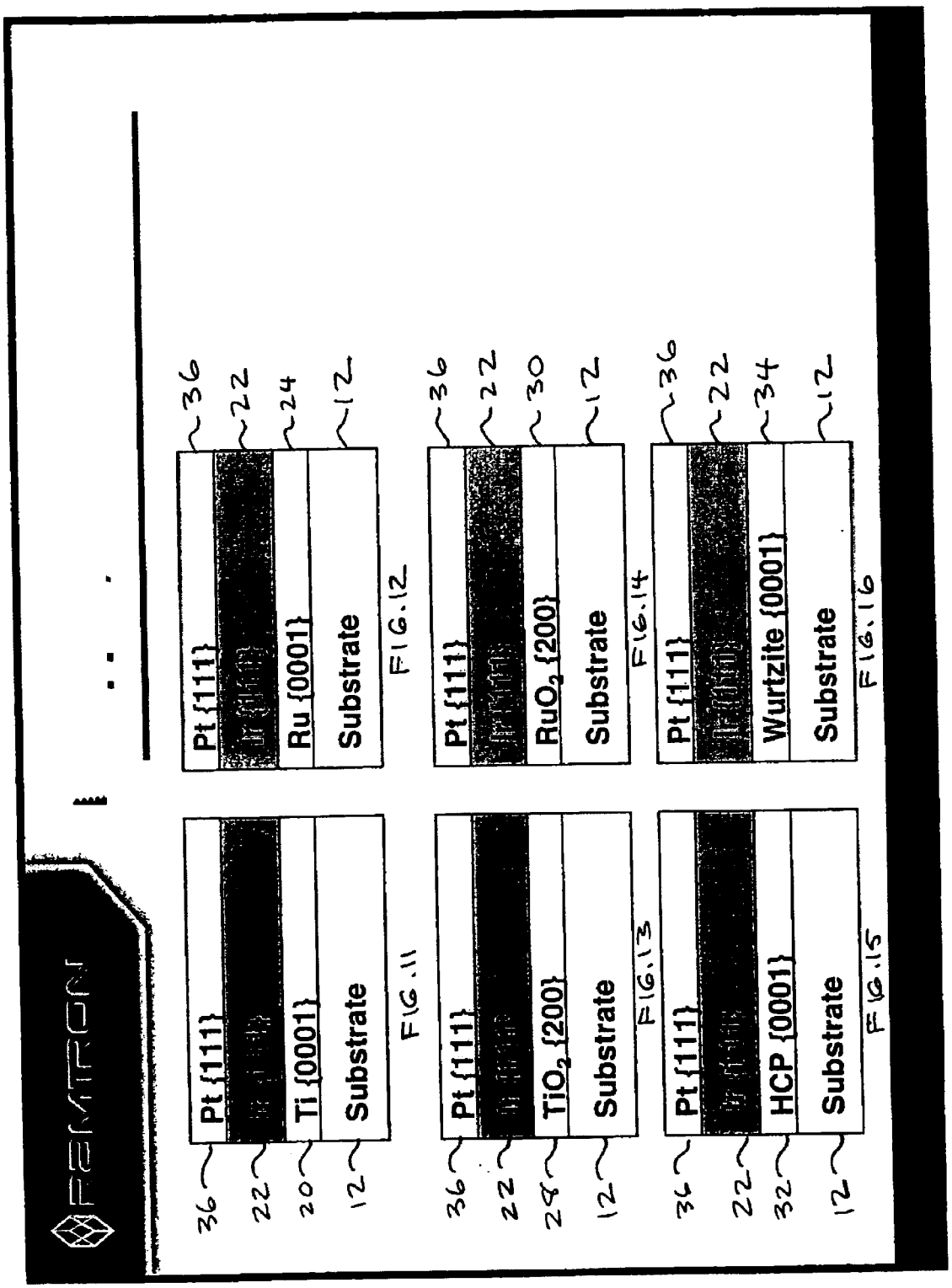

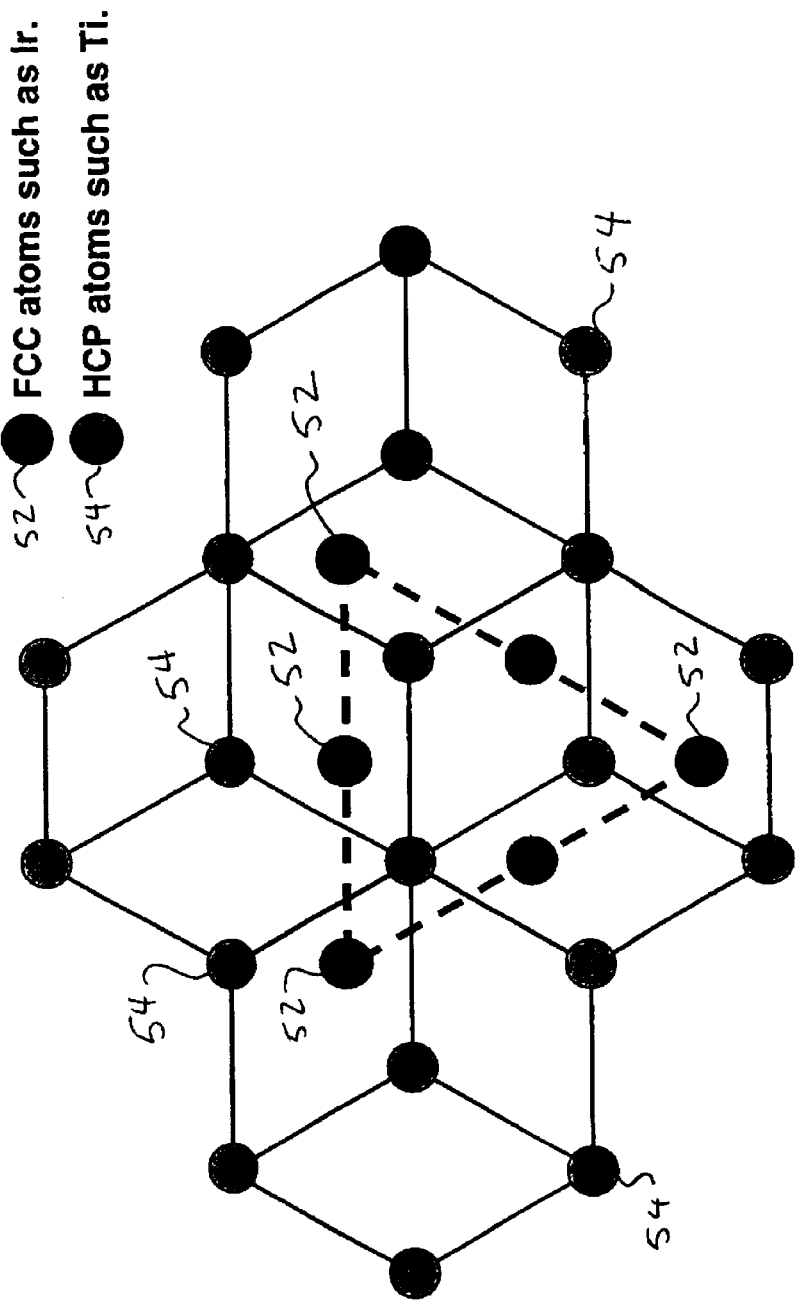

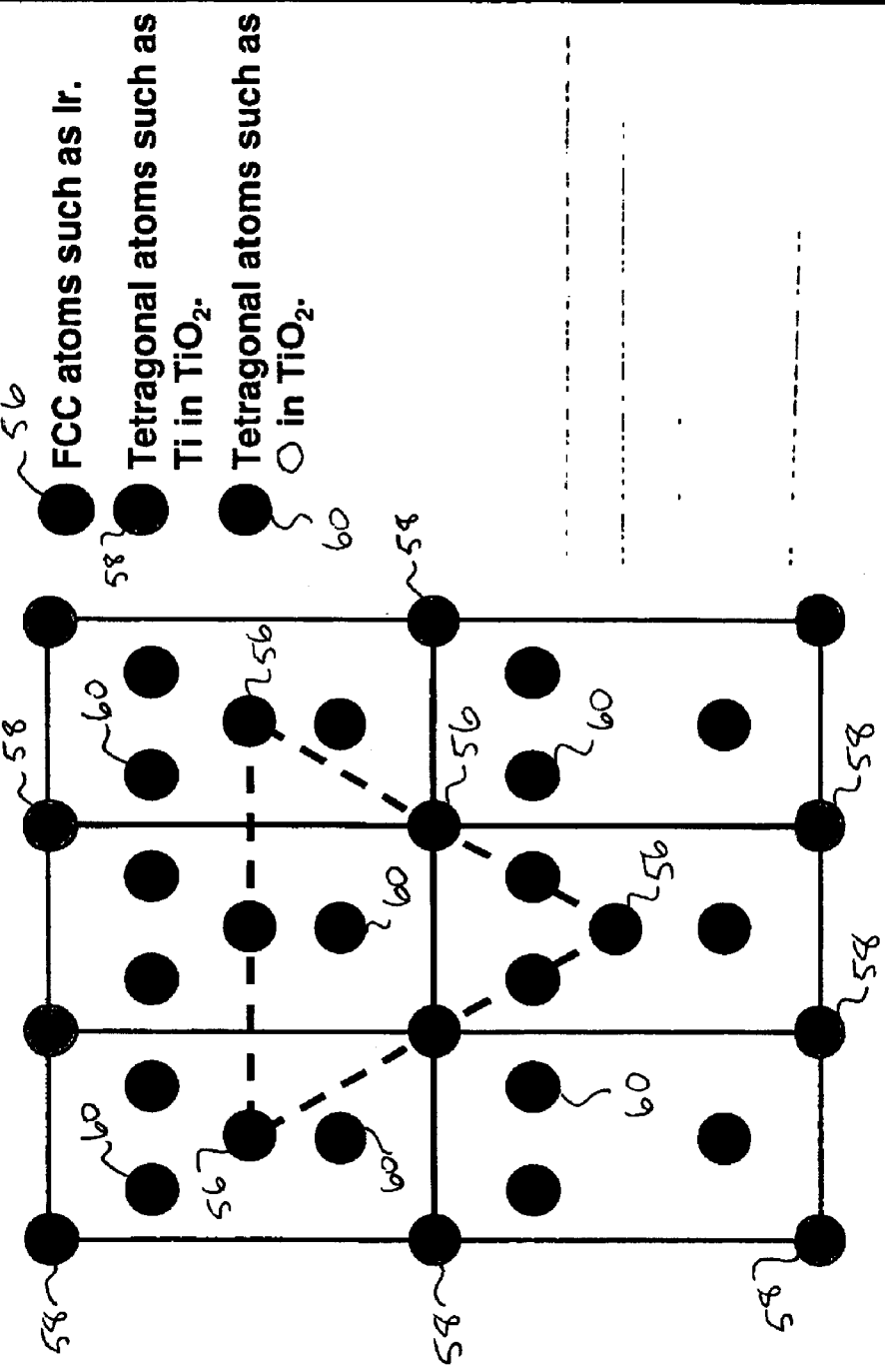

METHOD FOR PRODUCING CRYSTALLOGRAPHICALLY TEXTURED ELECTRODES FOR TEXTURED PZT CAPACITORS

BACKGROUND OF THE INVENTION

This invention pertains to ferroelectric capacitors and integrated circuit memory devices, and, more particularly, to textured electrodes for ferroelectric capacitors.

The term "texture" or "textured" generally refers to the crystallographic orientation of the material being discussed, and is not to be confused with the surface smoothness of the material. Specifically, the texture of the electrode and dielectric material being discussed refers to the crystallographic orientation of the material in the "Z-axis" and does not generally describe the orientation of the material in the X or Y axes (parallel to the surface of the integrated circuit). In fact, the grain structure of the material is generally random in the X or Y axes, yet it is ordered in the preferred orientation in the Z-axis of the material for maximizing electrical performance as is disclosed in greater detail below with respect to the description of the invention.

One possibility for improving the electrical performance of a ferroelectric memory is by texturing the ferroelectric dielectric material. Referring now to FIG. 1, a typical prior art ferroelectric capacitor 10 is shown including a substrate 12, a bottom electrode 14, a Perovskite ferroelectric dielectric layer 16 such as $Pb(Zr_{1-x}Ti_x)O_3$ ("PZT"), and a top electrode 18. The bottom electrode layer 14 and top electrode layer 18 are typically platinum or iridium. It is desirable for ferroelectric dielectric layer 16 to have a texture that maximizes electrical performance, and not a random grain structure. The use of a textured dielectric layer helps to maximize signal strengths and minimize operating voltage distribution since the polarization vector of all of the grains in the layer are oriented in the same direction. This is especially important if, as is required in integrated circuit memories, the capacitor area is very small (<1 $\mu m^2$) and the number of grains is also small (<50 grains). Randomly distributed grain orientation in the Z-axis of the dielectric film substantially affects signal strength and electrical memory performance.

Presently available bottom electrode structures and processing methods do not support a textured PZT ferroelectric dielectric layer and therefore process control and narrow single-bit signal distributions cannot be achieved for high density memories. With randomly oriented materials, the distribution in bit signals is large for capacitor sizes approaching the grain size of the PZT layer (typically 0.1–0.3 $\mu m$) since the switchable polarization is a vector property linked with specific crystal directions.

In particular, it has also been found that it is difficult to maintain good PZT crystallographic texture on iridium metal bottom electrodes. Iridium metal is oxidized when it is exposed to air or oxygen-containing environments. Currently, after iridium deposition, the iridium is typically exposed to air, resulting in a surface layer of $IrO_X$ that does not provide the proper template for textured PZT growth. While it may be possible to prevent iridium oxidation by directly depositing the PZT after iridium deposition and avoiding a vacuum break, the oxygen present in the PZT and the atmosphere used to deposit PZT can also cause iridium oxidation in an uncontrolled manner.

Exposure, therefore, of an iridium bottom electrode to atmosphere causes surface oxidation of the iridium. This surface oxidation causes an undesirable non-oriented PZT dielectric layer to be formed. Current platinum technology does not prevent oxygen diffusion through the bottom electrode. This, in turn, does not allow protection of contacts that lie below the bottom electrode in a capacitor-on-plug FRAM® memory architecture.

What is desired, therefore, is a bottom electrode structure for a ferroelectric capacitor that supports the growth of a properly textured ferroelectric dielectric film.

SUMMARY OF THE INVENTION

According to the present invention, a method is described for producing crystallographically textured electrodes for making ideally textured PZT capacitors for enhanced ferroelectric memory performance. The use of seed layers originating from hexagonal crystal structures with {0001} texture provides a template with a smooth surface for growth of {111} textured iridium, which exhibits the face-centered cubic ("FCC") structure. This seeding technique results in {111} textured iridium with a small surface roughness relative to the film thickness. The highly textured iridium acts as a template for {111} textured PZT growth. Textured PZT exhibits enhanced switched polarization, reduced operating voltage and also improves the reliability of PZT capacitors used in FRAM® memory and other microelectronic devices.

One advantage of using iridium is that iridium provides a barrier against oxygen diffusion. When the PZT capacitor is formed on top of a tungsten, silicon, or other plug material, oxidation of the plug is ideally prevented (or at least limited) to avoid excessively high contact resistance between the plug and the capacitor. Capacitor-over-plug architectures are normally required for high density memories that incorporate small capacitors (<1 $\mu m^2$). It is therefore desirable to maintain a textured PZT layer to have a maximum switching signal, low operating voltage and a narrow distribution in bit-to-bit response. With textured materials, all capacitors substantially exhibit the same switchable polarization since all the PZT grains exhibit the same texture.

During vapor phase deposition, materials with hexagonal crystal structures have a natural growth habit such that the basal plane, i.e., the {0001} plane, prefers to grow parallel to the surface of a planarized substrate. This growth habit results in the formation of {0001} textured films with smooth surfaces that terminate on the {0001} plane. This smooth {0001} lattice plane in turn provides an ideal growth surface for growth of a smooth subsequent layer. In addition, the basal planes of hexagonal structure materials are close-packed planes that provide for an excellent template for growth of {111} textured films exhibiting an FCC crystal structure. The {111} planes in the FCC structure are also close-packed planes. In fact, the only difference between hexagonal close-packed structures and face-centered cubic structures is the stacking sequence of the close-packed planes. ABC stacking is exhibited in FCC structures and AB stacking is exhibited in HCP structures. The FCC (111) plane can have a good lattice match with the HCP (0001) plane. A mismatch as large as 25% can be accommodated between the FCC (111) and HCP (0001) lattice while still assuring that the HCP (0001) lattice acts as a seed for textured growth of the FCC (111) lattice. The mismatch is given by:

$$\frac{2a_H - \sqrt{2}\, a_F}{\sqrt{2}\, a_F}$$

where $a_H$ is the unit cell parameter for the hexagonal basal plane of the seed layer and $a_F$ is the unit cell parameter for the FCC electrode layer.

Since the HCP seed layer is textured, the lattice match of the FCC and HCP structures introduce a texture of the FCC material. The lattice match between the FCC (111) and HCP (0001) planes is confined within a single grain; therefore the FCC layer exhibits a {111} texture perpendicular to the plane of the substrate, but the grains are randomly oriented with respect to relative rotations within the plane of the substrate.

Tetragonal seed layers that form a distorted hexagonal sub-lattice can also be used to achieve textured Ir films. Such films can be formed by using thermal oxidation or nitridation of smooth {0001} as-grown hexagonal metal films, resulting in alternative oxide and nitride based seed layers with smooth surfaces. These oxide and nitride seed layers can also be used to achieve better lattice matching with FCC electrodes and therefore result in improved texture of the FCC electrode film. Formation of compound hexagonal and tetragonal seed layers can also be achieved by deposition processing such as sputtering and MOCVD. An example of a tetragonal seed layer that can be formed by thermal oxidation is TiO$_2$, which exhibits the rutile structure and a distorted hexagonal oxygen sub-lattice. Hexagonal Ti with an {0001} texture transforms to tetragonal TiO$_2$ with a {100} texture. The FCC (111) lattice can have a good match with the tetragonal rutile (200) lattice provided that the lattice mismatch is less than 25%. The lattice mismatch in this case is given by $$\frac{2c_T - \sqrt{2}\, a_F}{\sqrt{2}\, a_F} \text{ and } \frac{a_T - \sqrt{\frac{3}{2}}\, a_F}{\sqrt{\frac{3}{2}}\, a_F}$$

where $c_T$ and $a_T$ are the unit cell parameters for the tetragonal seed layer and $a_F$ is the unit cell parameter for the FCC electrode layer.

Because of the natural growth habit of the hexagonal close-packed ("HCP") structure of titanium, titanium growth with an {0001} texture provides for an excellent seed layer for the growth of {111} textured FCC iridium. Because of the strong growth habit of titanium, this seed layer can be grown on a variety of amorphous and crystalline substrates while still maintaining a high quality of {0001} texture. Because the {0001} titanium texture can be maintained on a variety of substrates, it provides for a universal seed layer that can be used on top of an interlevel dielectric, plug, and other barrier materials that are placed on top of the plug structure. In turn, the {0001} textured titanium can be thermally oxidized to form a stable oxide that also provides not only a thermally stable seed layer but also a smooth seed layer that allows the growth of {111} textured iridium that can act as a bottom electrode for textured PZT growth. The thermally oxidized titanium exhibiting a {100} textured rutile structure is ideally grown such that it exhibits a 200 X-ray diffraction ("XRD") rocking-curve peak with a full width at half maximum ("FWHM") of less than 5°. With such a seed layer, the iridium can be grown with a 111 rocking-curve FWHM of less than 5°, which is ideally required to achieve a high quality 111 PZT texture with a 111 rocking-curve of less than 5° omega. Such a PZT texture is ideally needed to achieve the full performance benefits of the textured PZT. In order to achieve the high degree of iridium texture, the iridium is ideally deposited in a temperature range of 300 to 700° C.

The method of the present invention includes a hexagonal close-packed seed layer, which is employed as-grown, oxidized or nitrided by thermal processing, with an FCC bottom electrode, and can be extended to other materials. Potential hexagonal metal seed layers include titanium, cobalt, zirconium and ruthenium, among other materials as is explained in greater detail below. The advantage of using ruthenium is that oxidation of ruthenium still results in a conducting layer.

Other hexagonal materials that can act as a seed layer include BN, AlN, GaN, InN, ZnO, and other wurtzite (or hexagonal) structure materials, as well as solid solutions or doped derivatives of these materials. For these materials, the anion sub-lattice provides the close-packed basal plane that provides the lattice match with the FCC close-packed (111) plane.

These can be formed by a variety of thin film deposition processes including sputtering and MOCVD. The advantage of using the wurtzite structure nitrides is that the seed layer can also provide additional protection against oxidation of the plug since it is known that certain nitrides are resistant to oxidation.

Other seed layer compounds having a hexagonal or tetragonal crystal structure that contains a hexagonal or distorted hexagonal sublattice can be used if that compound provides a lattice match with the iridium {111} plane within 25%. Additionally, other FCC electrode materials can be used in place of iridium and these include Pt, Pd, Ag, Au, Cu, and Ni, among other materials as is explained in further detail below.

The present invention also provides a means to prevent iridium oxidation and provides a means for textured PZT growth with a narrow rocking-curve FWHM. The iridium layer provides a barrier against oxygen diffusion, which can be used to prevent oxidation of conducting plugs in a FRAM® capacitor-over-plug ferroelectric memory architecture.

Textured iridium with a 111 rocking-curve FWHM of less than 5° is first deposited to a thickness of 1–100 nm. Without breaking vacuum, a platinum layer (1 to 50 nm thick) is deposited on top of the iridium. Because of the close lattice match and same FCC structure of platinum and iridium, the platinum grows with a {111} texture that has a 111 rocking-curve FWHM similar to iridium. Since the platinum does not oxidize when exposed to air and oxidizing environments, the Pt/Ir electrode is stable against oxidation. Textured PZT can easily be grown on the platinum layer when the platinum has a 111 rocking-curve FWHM of less than 5°. The high degree of PZT texture ensures high performance ferroelectric properties for FRAM® memory applications. An additional advantage is the PZT provides a narrow distribution in the signal sensed from bits comprising the FRAM memory.

The foregoing and other objects, features and advantages of the invention will become more readily apparent from the following detailed description of a preferred embodiment of the invention, which proceeds with reference to the accompanying drawings.

BRIEF DESCRIPTION OF THE DRAWINGS

FIGS. 2–10 are cross-sectional diagrams of bottom electrode structures for a ferroelectric capacitor fabricated according to a first embodiment of the present invention;

FIGS. 11–16 are cross-sectional diagrams of bottom electrode structures for a ferroelectric capacitor fabricated according to a second embodiment of the present invention;

FIG. 20 is an atomic-level diagram showing the in-plane lattice match of a {111} FCC electrode and a {0001} HCP seed layer; and FIG. 21 is an atomic-level diagram showing the in-plane lattice match of a {111} FCC electrode and a {100} tetragonal rutile-type seed layer.

DETAILED DESCRIPTION

Figure 1:
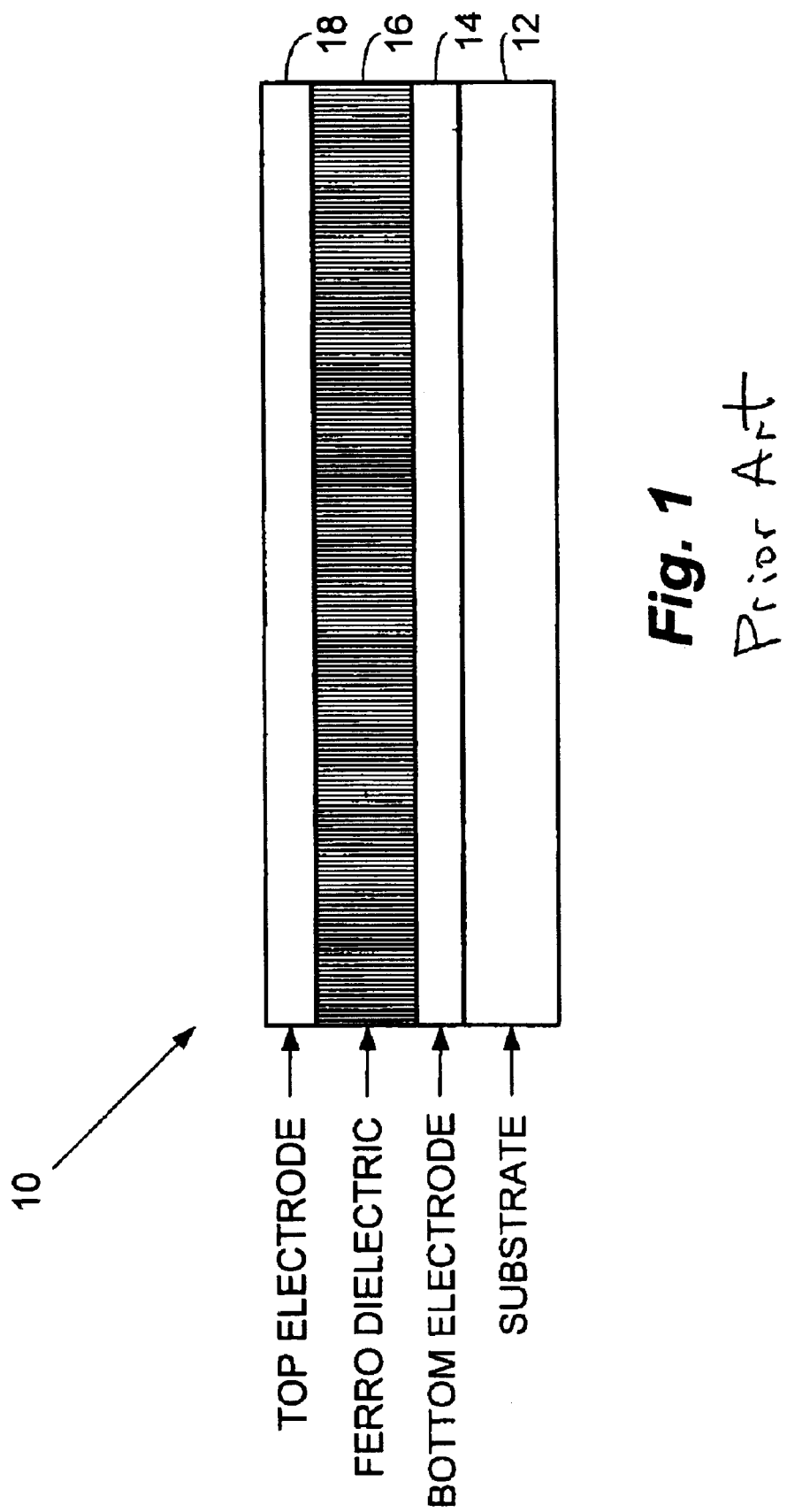
FIG. 1 is a cross-sectional diagram of a prior art ferroelectric capacitor.

Referring generally now to FIGS. 2–10 and 18, a bottom electrode structure for a ferroelectric capacitor includes a hexagonal close-packed seed layer and an iridium bottom electrode layer 22. The seed layer is deposited on a substrate 12 to form a layer about 200 Angstroms thick. An iridium bottom electrode layer 22 is deposited on the surface of the seed layer to form a layer about 500–1000 Angstroms thick. The seed layer can be formed from a variety of different materials as is described in further detail below. The seed layer ideally has a rocking-curve full-width at half maximum ("FWHM") (002 for hexagonal or 200 for tetragonal seed layers) of less than five degrees. The "rocking curve" refers to a measure of the diffracted intensity as a function of sample rotation while maintaining the Bragg condition for the diffracting crystal planes in the use of X-ray and electron diffraction techniques to determine the orientation of the as-deposited film. FWHM refers to the width of the rocking curve peak at half maximum intensity. A measurement of less than five degrees means that the rotation of the sample within the diffraction plane is less than ±2.5° from the 0° angle that has equal incident and reflected beam angles, i.e. the normal Bragg condition. The iridium bottom electrode layer 22 also has a 111 rocking-curve FWHM of less than five degrees since the iridium layer 22 is oriented by the underlying seed layer. The iridium layer 22 thus attains a desirable {111} crystallographic texture.

With respect to FIGS. 2–10 and 18, the method of forming a bottom electrode structure for a ferroelectric capacitor according to a first embodiment of the present invention includes depositing a hexagonal close-packed seed layer, and depositing an iridium bottom electrode layer 22 on the surface of the seed layer. For the case of a Ti seed layer the Ti can be deposited by magnetron sputter deposition by using a power of 1 kW (applied to a 12 in. diameter target). The Ti is deposited at a pressure of 0.3–1.0 Pa. The deposition rate should be approximately 3 nm/s or less. Slower deposition rates will result in a better as-deposited {0001} texture. The critical factor is that the Ti seed layer is grown such that the 002 rocking-curve FWHM is less than 5°. Other deposition methods such as evaporation or CVD could also be used. The TiO$_2$ seed layer is formed by annealing a {0001} textured Ti seed layer in air or flowing O$_2$ at a temperature of 500–750° C. for 1–60 min. This forms a TiO$_2$ seed layer with a rutile crystal structure and a texture such that the 200 rocking-curve is less than 5°. The TiO$_2$ seed layer could be grown by other techniques provided that the {200} texture can be achieved. Ideally, all the hexagonal seed layers must have {0001} texture with a 002 rocking-curve FWHM of less than 5°. The tetragonal seed layers must have a {100} texture with a 200 rocking-curve FWHM of less than 5°.

The iridium bottom electrode layer 22 is deposited by DC magnetron sputtering at a temperature of between 300 and 700 degrees Centigrade, at a deposition power of between 500 and 1000 Watts applied to a 12 in. diameter target, and at a deposition pressure of between 0.3 and 3.0 Pa in an argon or other inert gas atmosphere. The deposition rate is approximately 1 nm/s. The deposition conditions are ideally controlled such that the stress of the film is less than 1 GPa tensile or compressive and such that the Ir film nucleates with a {111} texture from the seed layer. Optimization of deposition conditions within this range of parameters results in a {111} texture that produces a 111 rocking-curve of less than 5°.

In general, FIGS. 2–10 show single or double seed layers fabricated from various hexagonal close packed materials that induce the growth of the preferred {111} textured iridium bottom electrode layer 22.

Referring now to FIGS. 2 and 4, a substrate 12 and bottom electrode structure is shown, wherein the bottom electrode structure includes a seed layer and a {111} iridium layer 22. In FIG. 2 the seed layer 20 is a {0001} titanium layer and in FIG. 4 the seed layer 28 is a {100} titanium dioxide layer.

Referring now to FIGS. 3 and 5, a substrate 12 and bottom electrode structure is shown, wherein the bottom electrode structure includes a seed layer and a {111} iridium layer 22. In FIG. 3 the seed layer 24 is a {0001} ruthenium layer and in FIG. 5 the seed layer 30 is a {100} ruthenium dioxide layer.

Referring now to FIG. 6, seed layer 32 is fabricated from any HCP {0001} textured seed layer.

Referring now to FIG. 7, seed layer 34 is fabricated from a {0001} textured wurtzite structure material. Wurtzite is a specific type of hexagonal crystal structure. In these materials only the anion sub-lattice has hexagonal close packing. But this anion sub-lattice can still provide sufficient lattice matching to be used as a seed layer for Ir. The specific deposition conditions for these materials can vary greatly depending on the composition. It is important to note that materials with this hexagonal structure can be used as seed layers provided that they are grown with a {0001} texture that exhibits a 002 rocking-curve FWHM of less than 5°.

In FIGS. 8 and 9, the seed layer is formed by depositing a first layer of {0001} titanium 20 or {100} titanium dioxide 28 about 5–40 nm thick, followed by depositing a second layer of {111} platinum about 5–100 nm thick. The platinum is deposited under conditions similar to those described above with respect to titanium and titanium oxide. The platinum layer is deposited at a temperature of about 500° C., at a target power of about 1 kWatt, at a pressure of between 0.3 to 2.0 Pa.

In FIG. 10, the seed layer is formed by depositing a first layer 32 of a {0001} textured HCP-type seed layer or a layer 34 of {0001} textured wurtzite material to a thickness of between 5 and 40 nm, followed by depositing a second layer 26 of {111} platinum to a thickness of between 5 and 100 nm thick.

Figure 18:
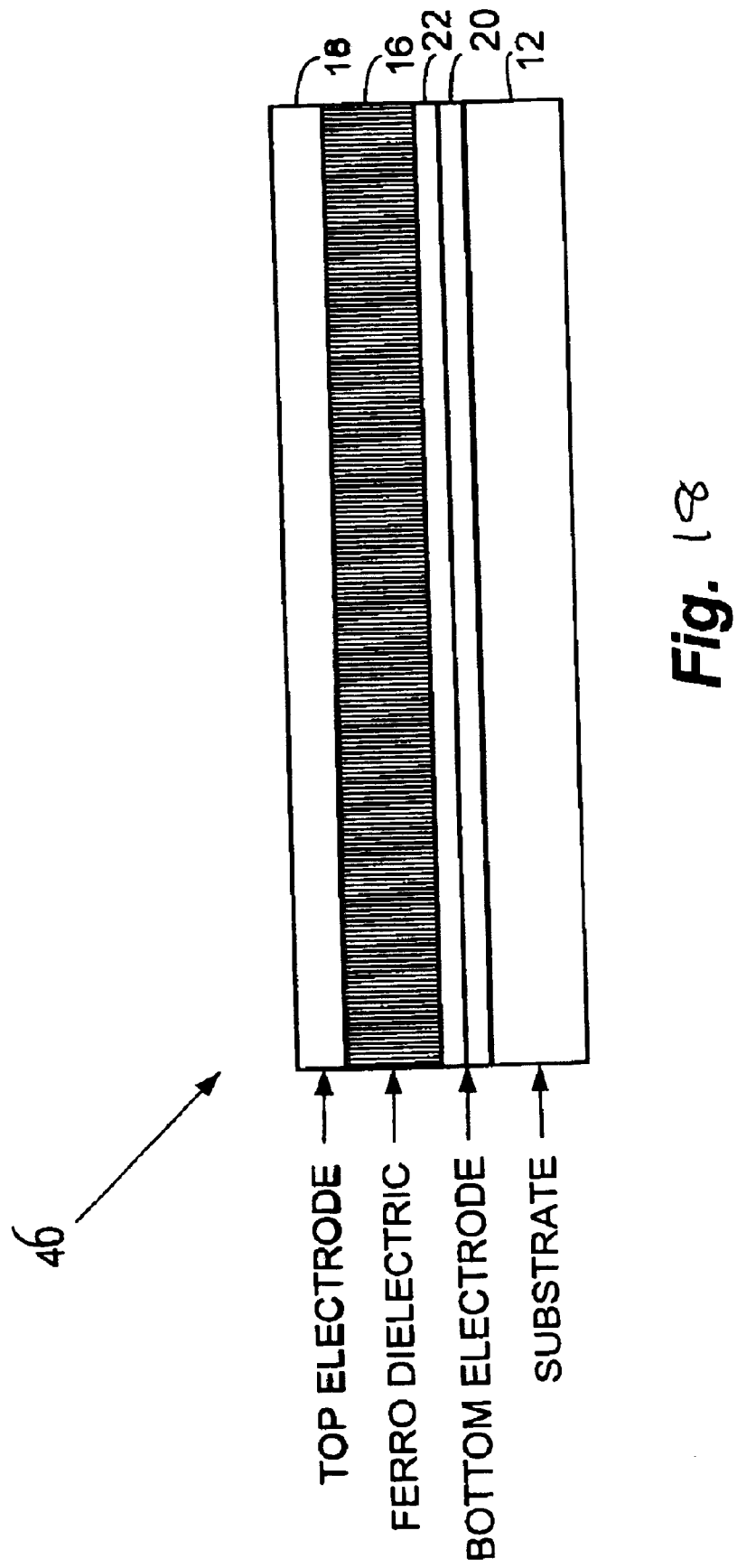
FIG. 18 is a cross-sectional diagram of a ferroelectric capacitor fabricated according to a first embodiment of the present invention.

Referring now to FIG. 18, a completed ferroelectric capacitor 46 is shown fabricated according to the method described above with respect to the first embodiment of the invention. A ferroelectric dielectric layer 16 is deposited on the top surface of the iridium bottom electrode layer 20, 22 without breaking a vacuum in order to prevent oxidation of the iridium layer 22. The ferroelectric dielectric layer 16 can be a PZT ferroelectric layer, which will be properly oriented due to the texture of the underlying iridium layer 22.

Referring generally now to FIGS. 11–16 and 19 a bottom electrode structure for a ferroelectric capacitor is shown for a second embodiment of the present invention including a hexagonal close-packed seed layer, an iridium bottom electrode layer 22, and a platinum cap layer 36. The platinum cap layer 36 is included as shown in FIGS. 11–16 and 20 in order to prevent oxidation of the iridium bottom electrode layer 22, and to allow for subsequent processing beyond bottom electrode structure without the necessity of maintaining a vacuum. The platinum cap layer 36, however, should ideally be deposited without breaking a vacuum after depositing the iridium layer 22.

The platinum cap layer 36 is ideally deposited to a layer thickness of between 1 and 50 nm. Platinum cap layer 36 has a 111 rocking-curve FWHM of less than five degrees and a {111} crystallographic texture. The platinum cap layer 36 is deposited at temperature of between 300 and 700 degrees Centigrade, at a deposition power of between 500 and 1000 Watts, and at a deposition pressure of between 0.5 and 2.0 Pa. An argon or other inert gas atmosphere is used.

In FIGS. 11 and 13, platinum cap layer 36 is deposited over a bottom electrode structure including a titanium seed layer 20 or a titanium dioxide seed layer 28.

In FIGS. 12 and 14, platinum cap layer 36 is deposited over a bottom electrode structure including a ruthenium seed layer 24 or a ruthenium dioxide seed layer 30.

In FIGS. 15 and 16, platinum cap layer 36 is deposited over a bottom electrode structure including a seed layer with an HCP crystal structure or a seed layer a with a wurtzite layer.

Figure 19:
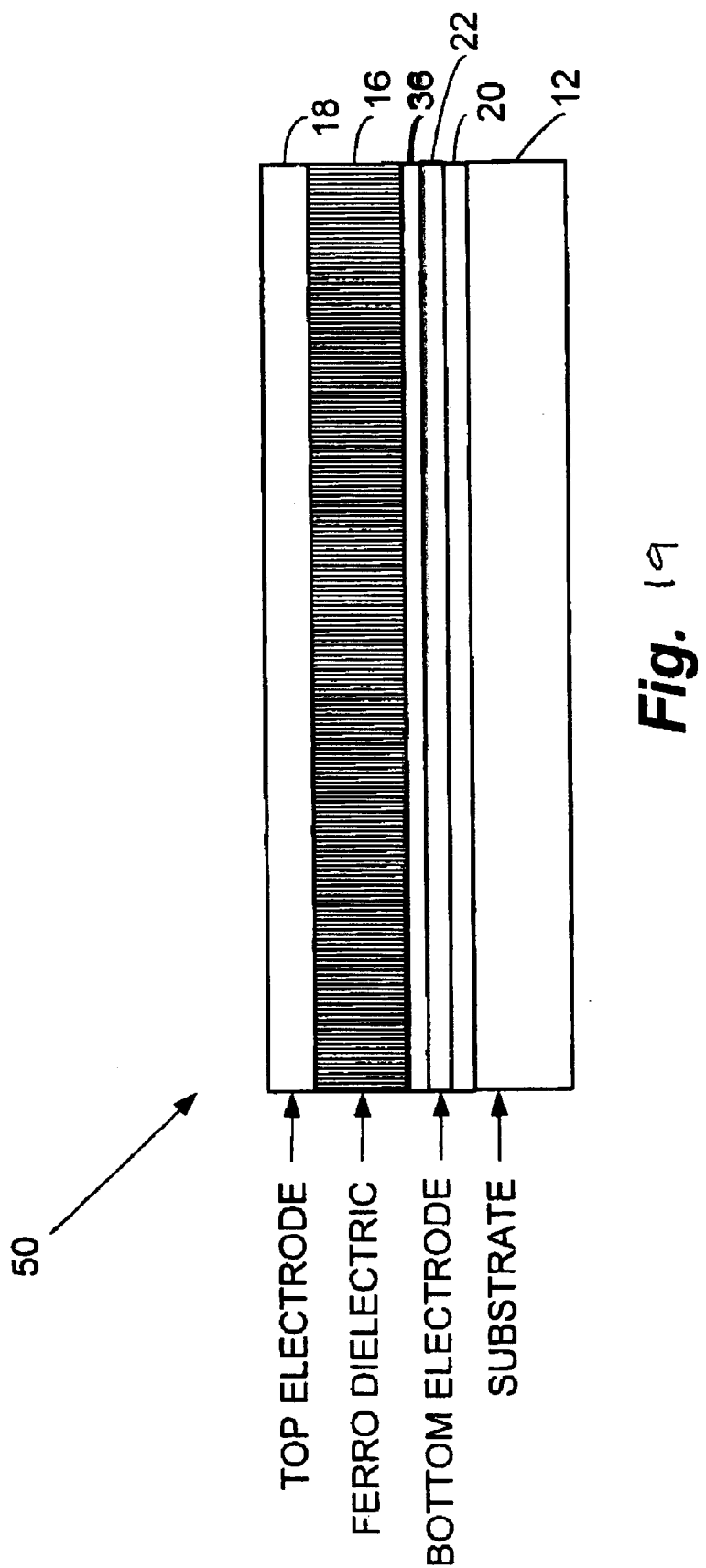
FIG. 19 is a cross-sectional diagram of a ferroelectric capacitor fabricated according to a second embodiment of the present invention.

Referring now to FIG. 19, the completed ferroelectric capacitor 50 is shown fabricated according to a second embodiment of the present invention 30. The ferroelectric dielectric layer 18 is deposited on a top surface of the platinum cap layer 36 and this can be done after a vacuum break since the underlying iridium bottom electrode layer 22 is protected from further oxidation. As before, the ferroelectric dielectric layer 16 can be a PZT ferroelectric layer about 20–200 nm thick, or as thick as required for a specific application.

Figure 17:
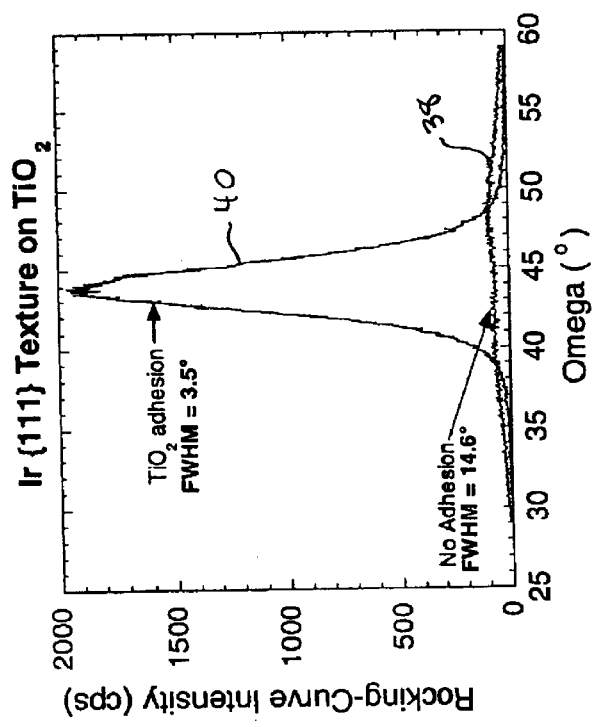
FIG. 17 is a plot showing the Ir 111 rocking curve with a TiO2 rutile seed layer and without a seed layer, wherein the TiO2 seed layer allows the formation of a highly {111} textured Ir with a rocking-curve FWHM of less than 4°.

FIG. 17 is a plot showing the Ir 111 rocking curve with a $TiO_2$ rutile seed layer and without a seed layer. The $TiO_2$ seed layer allows the formation of a highly {111} textured Ir with a rocking-curve FWHM of less than 4°.

Table 1 gives examples of the mismatch for FCC Ir and Pt and several types of hexagonal seed layers. FIG. 20 shows how the atom positions of the FCC (111) plane can stack on top of the HCP (0001) plane.

TABLE 1

| Material | Structure | A (Å) | C (Å) | Ir Mismatch (%) | Pt Mismatch (%) |
|---|---|---|---|---|---|
| Ir | FCC | 3.8394 | | | |
| Pt | FCC | 3.9231 | | | |
| Be | HCP | 2.2859 | 3.5843 | −15.80 | −17.60 |
| Co | HCP | 2.507 | 4.07 | −7.66 | −9.63 |
| Ru | HCP | 2.7058 | 4.2819 | −0.33 | −2.46 |
| Ti | HCP | 2.95 | 4.686 | 8.66 | 6.34 |
| Zr | HCP | 3.232 | 5.147 | 19.05 | 16.51 |

TABLE 1-continued

| Material | Structure | A (Å) | C (Å) | Ir Mismatch (%) | Pt Mismatch (%) |
|---|---|---|---|---|---|
| ZnO | Wurtzite | 3.2498 | 5.20066 | 19.70 | 17.15 |
| BN | Wurtzite | 2.553 | 6.6562 | −5.96 | −7.97 |
| AlN | Wurtzite | 3.1114 | 4.9792 | 14.61 | 12.16 |
| GaN | Wurtzite | 3.186 | 5.178 | 17.35 | 14.85 |
| InN | Wurtzite | 3.54 | 5.705 | 30.39 | 27.61 |

Table 2 gives examples of the mismatch for FCC Ir and Pt and several types of tetragonal seed layers. FIG. 21 shows how the atom positions of the FCC (111) plane can stack on top of the tetragonal (100) plane. FIG. 21 shows a projection of the oxygen and titanium positions in the bottom half of the rutile cell as viewed from the {100} direction. Superimposed on top of the projection are the positions of the FCC atoms in the {111} plane.

TABLE 2

| Material | Structure | a (Å) | c (Å) | Ir Mismatch (%) | Pt Mismatch (%) |
|---|---|---|---|---|---|
| Ir | FCC | 3.8394 | | | |
| Pt | FCC | 3.9231 | | | |
| $TiO_2$ | Rutile | 4.5933 | 2.9592 | 9.00, −2.32 | 6.67, −4.40 |
| $RuO_2$ | Rutile | 4.4902 | 3.1059 | 14.40, −4.51 | 11.96, −6.55 |
| $IrO_2$ | Rutile | 4.4983 | 3.1544 | 16.19, −4.34 | 13.71, −6.38 |
| $SnO_2$ | Rutile | 4.738 | 3.188 | 17.43, 0.76 | 14.92, −1.39 |

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

I claim:

1. A bottom electrode structure for a ferroelectric capacitor comprising:
   a seed layer;
   a bottom electrode layer; and
   a cap layer, wherein the lattice mismatch between bottom electrode layer and the seed layer is within ±25%.

2. The bottom electrode structure of claim 1 in which the seed layer comprises a hexagonal close-packed seed layer.

3. The bottom electrode structure of claim 1 in which the seed layer comprises a wurtzite crystal structure seed layer.

4. The bottom electrode structure of claim 1 in which the seed layer comprises a tetragonal crystal structure seed layer.

5. The bottom electrode structure of claim 1 in which the bottom electrode layer comprises an iridium layer.

6. The bottom electrode structure of claim 1 in which the bottom electrode layer comprises a layer of material selected from the group consisting of Pt, Pd, Ag, An, Cu, and Ni.

7. The bottom electrode structure of claim 1 in which the cap layer comprises a platinum layer.

8. The bottom electrode structure of claim 1 in which the seed layer comprises a layer about 5 to 40 nm thick.

9. The bottom electrode structure of claim 1 in which the bottom electrode layer comprises a layer about 50 to 100 nm thick.

10. The bottom electrode structure of claim 1 in which the cap layer comprises a layer about 1 to 50 nm thick.

11. The bottom electrode structure of claim 1 in which the seed layer comprises a layer having a 002 rocking-curve FWHM of less than five degrees for hexagonal close-packed and wurtzite crystal structure seed layers.

12. The bottom electrode structure of claim 1 in which the seed layer comprises a layer having a 200 rocking-curve FWHM of less than five degrees for tetragonal crystal structure seed layers.

13. The bottom electrode structure of claim 1 in which the bottom electrode layer comprises a layer having a {111} rocking-curve FWHM of less than five degrees.

14. The bottom electrode structure of claim 1 in which the iridium bottom electrode layer comprises a layer having a {111} crystallographic texture.

15. The bottom electrode structure of claim 1 in which the seed layer comprises a titanium or titanium dioxide layer.

16. The bottom electrode structure of claim 1 in which the seed layer comprises a ruthenium or ruthenium dioxide layer.

17. The bottom electrode structure of claim 1 in which the seed layer comprises a cobalt or zirconium layer.

18. The bottom electrode structure of claim 1 in which the seed layer comprises a layer of material selected from the group consisting of BN, AlN, GaN, InN, and ZnO.

19. The bottom electrode structure of claim in 1 which the seed layer comprises:

a first layer of titanium or titanium dioxide; and a second layer of platinum.

20. The bottom electrode structure of claim 1 in which the seed layer comprises:

a first layer having a wurtzite crystal structure; and a second layer of platinum.

21. A method for forming a bottom electrode structure for a ferroelectric capacitor comprising:

depositing a seed layer;

depositing a bottom electrode layer; and depositing a cap layer, wherein the lattice mismatch between bottom electrode layer and the seed layer is within ±25%.

22. The method of claim 21 in which depositing the seed layer comprises depositing a hexagonal close-packed seed layer.

23. The method of claim 21 in which depositing the seed layer comprises depositing a wurtzite crystal structure seed layer.

24. The method of claim 21 in which depositing the seed layer comprises depositing a tetragonal crystal structure seed layer.

25. The method of claim 21 in which depositing the bottom electrode layer comprises depositing an iridium layer.

26. The method of claim 21 in which depositing the bottom electrode layer comprises depositing a layer of material selected from the group consisting of Pt, Pd, Ag, An, Cu, and Ni.

27. The method of claim 21 in which depositing the cap layer comprises depositing a platinum layer.

28. The method of claim 21 in which depositing the seed layer comprises depositing a layer about 5 to 40 nm thick.

29. The method of claim 21 in which depositing the bottom electrode layer comprises depositing a layer about 50 to 100 nm thick.

30. The method of claim 21 in which depositing the cap layer comprises depositing a layer about 1 to 50 nm thick.

31. The method of claim 21 in which depositing the iridium bottom electrode layer comprises depositing iridium at a substrate temperature of between 300 and 700 degrees Centigrade.

32. The method of claim 21 in which depositing the iridium bottom electrode layer comprises depositing iridium at a deposition power of between 500 and 1000 Watts.

33. The method of claim 21 in which depositing the iridium bottom electrode layer comprises depositing iridium at a deposition pressure of between 0.5 and 3.0 Pa.

34. The method of claim 21 in which depositing the seed layer comprises depositing a titanium or titanium dioxide layer.

35. The method of claim 21 in which depositing the seed layer comprises depositing a ruthenium or ruthenium dioxide layer.

36. The method of claim 21 in which the seed layer comprises a cobalt or zirconium layer.

37. The method of claim 21 in which the seed layer comprises a layer of material selected from the group consisting of BN, AlN, GaN, InN, and ZnO.

38. The method of claim 21 in which depositing the seed layer comprises:

depositing a first layer of titanium or titanium dioxide; and depositing a second layer of platinum.

39. The method of claim 21 in which depositing the seed layer comprises:

depositing a first layer of material having a wurtzite crystal structure; and depositing a second layer of platinum.

40. The method of claim 21 further comprising depositing a ferroelectric dielectric layer on a top surface of the bottom electrode layer without breaking a vacuum.

41. The method of claim 40 in which depositing the ferroelectric dielectric layer comprises depositing a PZT ferroelectric layer.

42. The method of claim 40 in which depositing the ferroelectric dielectric layer on a top surface of the bottom electrode layer comprises depositing the ferroelectric layer on a top surface of an iridium bottom electrode layer.

* * * * *